United States Patent [19]
Constant

[11] 4,292,579
[45] Sep. 29, 1981

[54] THERMOELECTRIC GENERATOR

[76] Inventor: James N. Constant, 1603 Danbury Dr., Claremont, Calif. 91711

[21] Appl. No.: 953,550

[22] Filed: Oct. 23, 1978

Related U.S. Application Data

[63] Continuation-in-part of Ser. No. 834,452, Sep. 19, 1977, abandoned.

[51] Int. Cl.³ .................. H02N 3/00; H01L 35/28
[52] U.S. Cl. ........................ 322/2 R; 136/203; 310/306
[58] Field of Search .................. 310/4, 306; 322/2; 136/203, 205, 211

[56] References Cited
U.S. PATENT DOCUMENTS

| | | | |
|---|---|---|---|
| 2,881,384 | 4/1959 | Durant | 310/306 X |
| 2,915,652 | 12/1959 | Hatsopoulos et al. | 310/306 |
| 3,225,208 | 12/1965 | Wolfe | 310/306 |
| 3,462,310 | 8/1969 | Rubenstein | 310/306 X |
| 3,478,230 | 11/1969 | Otter, Jr. et al. | 310/306 |
| 4,039,352 | 8/1977 | Marinescu | |

OTHER PUBLICATIONS

Van Der Ziel, A. *Solid State Physical Electronics*, 3rd Ed., Prentice-Hall, Inc. pp.120–122; pp. 496–500.
Coughlin et al. *Semiconductor Fundamentals*, Prentice-Hall, Inc., pp. 12–15.

*Primary Examiner*—Robert J. Hickey

[57] ABSTRACT

Apparatus and method for a thermoelectric generator which converts heat directly from a heat source into electrical energy. This is done by applying an external electromotive force (emf) across a heated semiconductor to produce the drifting of electrons and thereby producing a current in the semiconductor which can be used in a load. Operation is possible at maximum power, maximum efficiency near unity, or at high combined power and efficiency. When used separately or in combination with a concentrating lens or combination of a heat absorber and heat exchanger there is provided a system for converting the sun's energy to electricity. When used in combination with a heat absorber and heat exchanger there is provided a system for converting fossil, nuclear, and geothermal heat energy to electricity.

36 Claims, 4 Drawing Figures

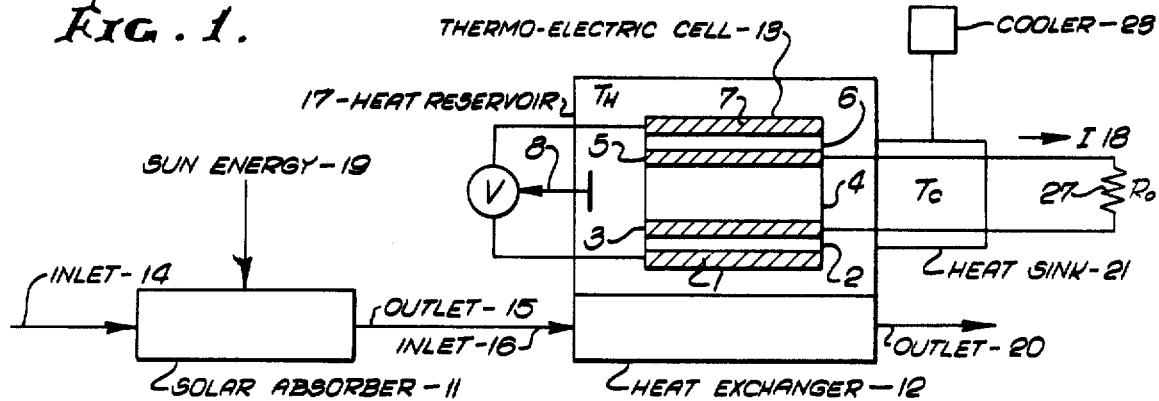
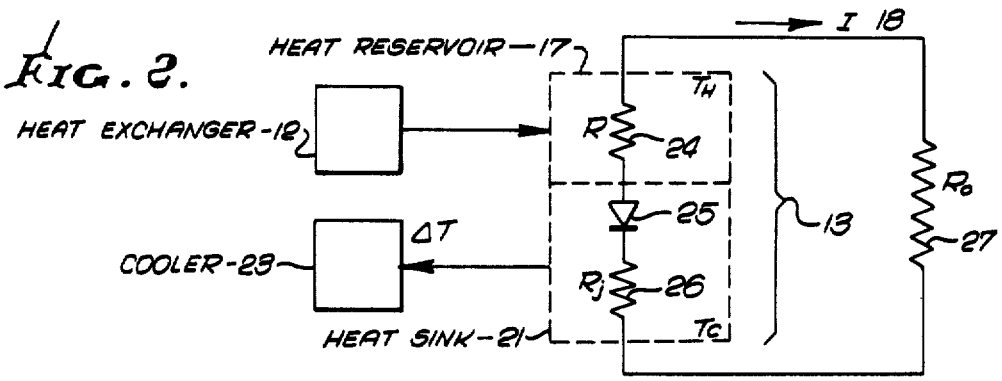
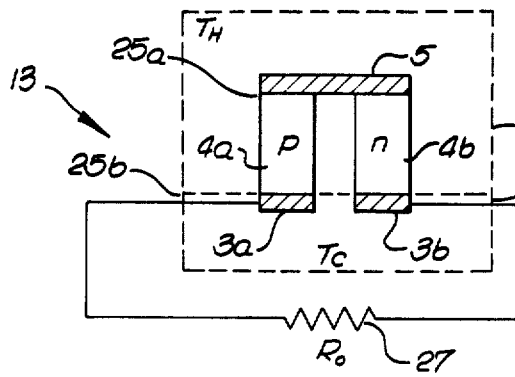
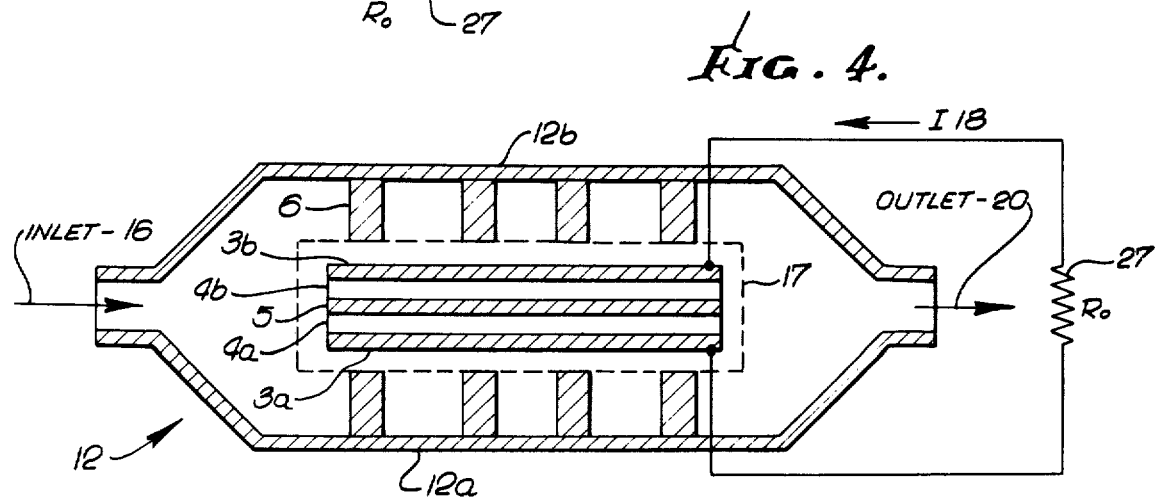

THERMOELECTRIC GENERATOR

BACKGROUND OF THE INVENTION

This application is a continuation-in-part of application Ser. No. 834,452 filed Sept. 19, 1977, now abandoned, entitled Thermoelectric Power Generator.

The present invention relates to energy conversion systems and more particularly to apparatus and method for the conversion of heat to electricity by direct conversion from a source which may be solar, nuclear, burned gases, fuel, hot liquids, etc.

There are few known methods for direct conversion of heat into electrical energy. Most of them require two heat sources, namely, a hot and a cold source, and therefore will attain efficiencies no greater than Carnot cycle efficiency, namely, $E = \Delta T/T_H$, where $\Delta T = T_H - T_c$ is the temperature difference between the hot and cold temperatures $T_H$ and $T_c$ of the sources. More specifically, there are substantial heat-losses inherent in each of these conventional methods which reduce their efficiency below the Carnot efficiency. For example, the conventional magnetohydrodynamic (MHD) system operates at 50-60% efficiency only when large amounts of power, e.g. 500 MW, are being delivered, while in the conventional thermoelectric generators based on the Seebeck effect the efficiency does not exceed 15%.

There are two exceptions where there is only a single source of heat and therefore the efficiency can exceed the Carnot cycle efficiency. In the "charge diffusion" system (see English Pat. No. 1,173,605), the operation depends on the diffusion current of charges in a semiconductor medium placed between refractory metal electrodes, along a path that must be many times greater than the mean free path of charges, and for which the electrical conductivity and thus the diffusion current are small. As a consequence there is a small delivered power. In combining cells in series and in parallel to raise the power, the space occupied by such an assembly becomes cumbersome and uneconomical. In the "differential work function" system (see U.S. Pat. No. 4,039,352), the operation depends on the drift current of charges in the semiconductor medium placed between metal electrodes, along a path smaller than the mean free path of charges, instead of being many times greater as in the "charge diffusion" system. As a consequence, much greater current may be obtained, with an appreciable reduction of the volume of the cell at the same time.

Clearly, the "differential work function" system (based on charge drift) produces more current than does the "charge diffusion" system. However, the work function differentials which can be provided by the "differential work function" system are small and, thus the drift current is small. As a consequence there is a limit to the delivered power. Thus, while the "differential work function" system has succeeded in removing the limits imposed by conductivity it continues to operate under the limits imposed by having small work function differentials. Moreover, work function differentials are fixed in the "differential work function" system.

These deficiencies, inherent in the "differential work function" system, are eliminated by the present invention. Like the "differential work function" system, the system of the invention is based on a charge drift process. As is well known, current flow in semiconductors can occur in two ways: first, when an electric field is applied and second, when a gradient in the carrier concentration is maintained. The first causes a current flow due to carrier drift; the second gives current flow due to carrier diffusion. In the "differential work function" system, the electric field is derived from the difference of work functions of electrodes. In the system of the invention, the electrical field is an external one that is applied to the semiconductor from a source of voltage in series or in parallel with electrodes. The advantage of having an externally applied field is that while it maintains the high conductivity it removes the limits of low electric fields inherent in the "differential work function" system. As a consequence, much greater current can be obtained by the invention system from a given volume of cell compared to the "differential work function" system. Moreover, the external electric field may be a variable one instead of the fixed field of the "differential work function" system.

The system of the present invention is particularly directed to the conservation of fossil and fission energy sources by collecting and converting the radiant energy of the sun into electrical energy at high power and high efficiency. A number of approaches have been made to the problem of collecting solar energy, but these have been impractical for various reasons. Some systems, such as the photovoltaic cell, have proved to be fairly effective, but their efficiency is practically restricted below 15% while their cost is prohibitive for other than highly specialized cases, e.g. unattended station and space applications. Other systems such as solar absorbers and heat exchangers, using exchange liquids or gases, have also proved to be fairly effective and indeed have achieved efficiencies approaching almost 100% at relatively low cost, for example pin fin and plate fin absorbers using fluids. However, heat absorbers and exchangers using fluids provide heat in the form of a heated exchange fluid and do not provide electricity. Thermoelectric power generators are also known in the art for converting the radiant energy of the sun, or heat energy, into electricity directly or by using solar absorbers and heat exchangers to convert the sun's energy to heat and then converting the heat directly to electricity. For example, a thermoelectric power generator is discussed and shown in the book by A. van der Ziel "Solid State Physical Electronics" Prentice Hall 1976, particularly in chapter 20, section 20.2c, and in FIGS. 20.4 and 20.5. Such thermoelectric power generators are particularly useful (see U.S. Pat. No. 3,225,208) for supplying the electric power for the electronic equipment carried by artificial earth satellites. In general, a thermoelectric power generator comprises a large number of thermocouples connected together in series, parallel or a combination thereof. Each thermocouple, in turn, comprises two junctions between dissimilar metals or semiconductors. One junction, referred to as the normally hot junction, is arranged so that solar radiation is converted into heat to raise the temperature of the junction. The other junction, referred to as the normally cold junction, is arranged so that heat is radiated away from the junction. Several techniques and methods are known for maximizing the absorption and radiation, respectively, of the normally hot and normally cold junctions so that a maximum temperature differential is produced between the junctions to cause a maximum flow of current through an appropriately connected load. However, as noted previously, these systems fail to provide high efficiency power because they are based on the principle of maximizing the temperature difference $\Delta T$ for their operation. In contrast, while the system of the invention may also use the prior art principle of maximizing the temperature difference $\Delta T$, its operation is based on the principle of applying an external electromotive force (emf) to a heated semiconductor and thereby substantially increasing the system power and efficiency.

The lack of sufficient power and efficiency of the prior art systems are usually overcome by the use of mirrors and Fresnel lens systems, which may require expensive heliostat tracking devices to keep them pointed at the sun. Some systems use relatively large arrays of mirrors covering large areas of land. While the system of the invention may also use such techniques for increasing input power, its substantially higher power and efficiency will require fewer mirrors, lenses and tracking devices, and smaller areas of land. Its capability to extract more power from the sun enables the conservation of the more traditional exhaustable sources such as oil, coal, nuclear, etc.

SUMMARY OF THE INVENTION

The system of the invention is relatively compact and the apparatus can be set up and operated at almost any desired location. Heat is applied directly to a thermoelectric cell, with a plurality of cells comprising the thermoelectric power generator system of the invention. The heat may be derived directly from the sun or from another source using an apparatus such as a heat exchanger.

A heat transfer fluid may be piped through a solar absorber panel to pick up the heat energy generated by converting the sun's energy to a heated fluid. The heated fluid may then be circulated to a heat exchanger to heat up a thermoelectric cell of the invention to generate electricity from the heat. Thus, when combined with conventional solar panels and heat absorbers, it is expected that the thermoelectric cells of the invention will convert the major portion of the sun's energy to electrical energy at high power and high efficiency.

The thermoelectric cell of the invention includes a heat absorber, for example one or more semiconductors sandwiched between metal plates. The semiconductor is heated, for example by exposing its flat side to the sun's energy or by heat provided from another apparatus such as a heat exchanger. The heated semiconductor has resistance R and produces random charge motions of electrons and holes at high thermal kinetic energies. The charges are then directed to the metal plates by applying an external electromotive force (emf) across the heated semiconductor. The term "external electromotive force" is used herein to distinguish the invention apparatus and method for providing an electric field across a heated semiconductor from the "differential work function" system of the prior art wherein the apparatus and method of providing an electric field across a heated semiconductor takes the specific and restricted form of a difference of work functions of electrodes. Thus, while the system of the invention may also use the prior art principles of the "differential work function" and "charge diffusion" systems, its operation will always include apparatus and method for applying an electric field across a heated semiconductor, not disclosed by the prior art. The external emf may be produced using any one of a number of sources, for example a voltage or current source in series or in parallel with the electrodes of the heated semiconductor.

N cells can be connected in series or in parallel and if an external load $R_o$ is connected to the N heated semiconductors a drift current will flow. Maximum power is achieved by maximizing the current I in load $R_o$ while maximum efficiency is achieved by operating the cell resistance R' much smaller than the load resistance $R_o$. Ideally, the current I is the product of the cell conductivity $\sigma$ and the externally applied emf U. If the cell conductivity is inversely proportional to the cell resistance R' and if the external emf U is independent of the cell resistance R' it then becomes possible to operate the cell simultaneously at high power and high efficiency.

Whether used directly or in combination with other apparatus, the system of the invention operates at any desired power and efficiency in winter and summer. The apparatus is fixed and has no moving parts excepting perhaps for circulating heated fluids in the combined apparatus. Therefore, the system remains operative at all times and is impervious to ordinary mechanical breakdowns.

While the thermoelectric cell of the invention is disclosed primarily for converting the sun's energy to electricity, directly or through the use of solar panels and heat exchangers, it will be obvious to those in the art that it can be used equally well for converting fossil, nuclear and geothermal heat energy to electricity.

It is therefore a general object of the invention to provide apparatus and method for generating substantial amounts of drift electricity at high efficiency from a heated semiconductor by applying an externally generated emf across the semiconductor, using a voltage source. It is another object of the invention to provide a system of the character described having a high cell conductivity. It is another object of the invention to provide a system of the character described having a high emf. It is another object of the invention to provide a system of the character described having a plurality of cells in series or in parallel.

It is another object of the invention to provide a system for extracting solar energy from the rays of the sun and converting said energy to a heated exchange fluid, converting the heated fluid to heat, and converting the heat to electricity in a system of the character described. It is another object of the invention to provide a system for converting fossil, nuclear and geothermal energy into a heated fluid, converting the heated fluid into heat, and converting the heat into electricity in a system of the character described.

It is another object of the invention to provide a system for extracting solar energy from the rays of the sun in a system of the character described using reflectors, concentrators and mirrors. It is another object of the invention to provide a system of the character described in which the heat source provides heat to the cell directly or indirectly through a heat exchanger. It is another object of the invention to provide a system of the character described in which the heat source is a pin fin heat exchanger. It is another object of the invention to provide a system of the character described in which the heat source provides radiated, convected or conducted heat to the cell.

It is another object of the invention to provide a system of the character described which includes a cooler for cooling a portion of the cell. It is another object of the invention to provide a system of the character described in which the cooler draws radiated, convected or conducted heat from the cell. It is another object of the invention to provide a system of the character described which includes means for providing the temperature difference between selected elements of the cell. It is another object of the invention to provide a system of the character described which operates at superconducting temperatures.

It is another object of the invention to provide a system of the character described in which the voltage source is a battery or device whose principle of operation depends on the Peltier, Seebeck and Thompson effects. It is another object of the invention to provide a system of the character described whose operation automatically compensates the voltage source for a change of temperature of the heat source. It is another object of the invention to provide a system of the character described in which the voltage source is connected in series or in parallel with the semiconductor. It is another object of the invention to provide a system of the character described in which the voltage source is connected to a grid of the semiconductor. It is another object of the invention to provide a system of the character described in which the voltage source provides power to the load.

It is another object of the invention to provide a system of the character described which operates at one of maximum power, maximum efficiency, and at selected power and efficiency. It is another object of the invention to provide a system of the character described without moving parts and therefore not subject to equipment breakdowns, maintenance and repair problems. It is another object of the invention to provide a system of the character described having small size, weight, complexity, power consumption and cost.

Other objects, advantages, features and results of the invention will more fully appear in the following description.

BRIEF DESCRIPTION OF THE DRAWINGS

The preferred embodiments of the present invention are illustrated in the accompanying drawing which forms a part of this description, in which:

FIG. 1 is a block diagram of a combination of a solar absorber panel, heat exchanger, and thermoelectric cell used to produce electricity;

FIG. 2 is a circuit diagram of a thermoelectric cell, shown as a combination of a discrete resistor and rectifier;

FIG. 3 is a circuit diagram of a thermoelectric cell, shown as a combination of p- and n- type semiconductors sandwiched between heat absorbing and metal plates; and FIG. 4 is a schematic diagram of a pin fin heat exchanger which includes a thermoelectric cell.

DESCRIPTION OF THE PREFERRED EMBODIMENTS

Older methods for the extraction of energy are based primarily on the use of solar photo-voltaic and thermovoltaic cells for direct conversion of the sun's energy and also use of solar absorbers and heat exchangers in combination with turbines. The main disadvantage of the older methods is the low efficiency and high cost of units. Solar cells have efficiencies no greater than about 15% while the combination of solar absorbers, heat exchangers, and turbines, although having relatively high efficiencies, are limited by costs. Another older method is based on the use of different work functions of metal-semiconductor junctions which indeed achieves efficiencies near unity but provides limited amounts of power. Older methods are temperature dependent for their operation and do not have temperature compensating capabilities to optimize their performance. In contrast, the invention method is based on a new thermoelectric cell comprising a heated semiconductor whose charges are driven by an externally applied electromotive force (emf) for direct conversion of heat into electricity and which can be used to convert the sun's energy directly, or which can be combined with high efficiency solar absorbers and heat exchangers, to supply electricity at high power and high efficiency at relatively low cost.

FIG. 1 is a block diagram of the combination of a solar absorber panel 11, heat exchanger 12, and thermoelectric cell 13 for providing electrical energy. The solar panel 11 is used to collect the sun's energy and convert same to heat. A cold fluid at inlet 14 is converted into a heated exchange fluid at outlet 15 of solar panel 11. The heated fluid from outlet 15 is inputted to heat exchanger 12 through its hot inlet at 16. Heat exchanger 12 heats cell 13 in heat reservoir 17 to produce electrical energy at output 18. The exchange fluid passing through solar panel 11 and heat exchanger 12 provides a substantial portion of the sun's energy 19 falling on solar panel 11 as heat to cell 13. The exchange fluid is heated in solar panel 11 and cooled in heat exchanger 12. The cooled exchange fluid is provided at outlet 20 of heat exchanger 12 and, ideally, is at the temperature of the fluid at cold inlet 14. It will be appreciated however that any residual heat in the fluid at outlet 20 can be used to do useful work and, in fact, may be required in a given application.

Solar panel 11 may be a conventional absorber for converting the sun's energy at 19 into a heated fluid at outlet 15, and heat exchanger 12 may be a conventional heat transfer unit for converting a heated fluid at inlet 16 to radiated, convected or conducted heat which accumulates in heat reservoir 17, and to a cold fluid at outlet 20. Solar panel 11 and heat exchanger 12 may comprise any one of a number of well known types including plates, plate fins, pipes, shell pipes, and pin fin absorbers and heat exchangers. It will be obvious therefore to select or construct solar panel 11 and heat exchanger 12 to obtain the desired performance approaching 100% efficiency for converting the sun's energy at 19 into heat for heating cell 13 in heat reservoir 17. Cell 13 is preferably a semiconductor which absorbs heat provided in heat reservoir 17 and provides electrical energy in the form of a current I at its output 18. The thermoelectric action of a semiconductor is well known, for example as shown in the book by R. Coughlin and F. Driscoll Jr., "Semiconductor Fundamentals" Prentice Hall 1976, particularly at pages 13 and 14.

In a simple implementation, as suggested by the reference just given, cell 13 may take the form of a semiconductor with a voltage source V applied in series with external load resistor $R_o$ 27. This arrangement will produce an emf across the semiconductor and thereby direct the motion of thermal electrons and holes in the semiconducor for producing one component of current I 18 with the other component of current I 18 being supplied by the voltage source V. The series voltage V may be obtained by using the Seebeck and Thompson voltages which can be generated by applying the temperature difference $\Delta T$ between the semiconductor and electrodes connecting it to the external load $R_o 27$. More generally, voltage source V may be a battery or any other suitable source.

Whatever voltage source V is used to produce the emf across the semiconductor, it is preferable that the current I 18 not flow through the emf source. This can be avoided following the invention method by shunting the voltage source V across the semiconductor through a high impedance in parallel with the semiconductor, or alternatively, by shunting the voltage source V through high impedance grids which may be provided in the semiconductor. For example, by implementing the semiconductor as a triode or p-n-p junction with the voltage source V applied to the n- type semiconductor portion of the junction. Thus, while the principle of creating drift currents in a heated semiconductor is well known there is no teaching in the prior thermoelectric generator art, with one exception, of how to provide apparatus and method for a thermoelectric generator which is based on this principle and which provides useful amounts of current I 18 into a load $R_o 27$. The one exception is the foregoing "differential work function" system which produces an emf proportional to the difference of work functions across the semiconductor. Moreover, there is no teaching in the prior art how to connect the voltage source V so the current I 18 does not flow through the sources. Nor does the prior art anticipate the problem of current limiting when the voltage source V is in series with the semiconductor.

In the cell 13, elements 1 and 7 are two identical metal plates forming a capacitor. Shunted across the capacitor is the external voltage source V. On the face of one of the metal plates there is deposited a plurality of vacuum thin films: films 2 and 6 are thin electrical insulators, films 3 and 5 are thin metals, and film 4 is the semiconductor. Metal films 3 and 5 may be ohmic or rectifying contacts. The thickness of the films may be on the order of some few microns but in any case will be determined by the application. Thermoelements 3, 4 and 5 are pressed together to insure a good electrical contact and these are sandwiched between plates 1 and 7 through electrical insulators 2 and 6.

If cell 13 just described is heated uniformly in heat reservoir 17 to the temperature $T_H$, a current I 18 will flow through the semiconductor 4 and through the external load $R_o 27$. The two wires that connect load $R_o 27$ to plates 3 and 5 may be the same metal to prevent any voltage being generated due to the Seebeck and Thompson effects that may appear if a temperature gradient $\Delta T$ exists between plates 3 and 5 and wires connecting load $R_o 27$. Alternatively, the two wires that connect load $R_o 27$ to plates 3 and 5 may be of a different metal or these may include semiconductors to purposely encourage the generation of a voltage at the junction of plates 3 and 5 and connecting wires to load $R_o 27$.

For best performance, heat exchanger 12 provides heat to heat reservoir 17 so that heat impinges all around cell 13. The external voltage V and load $R_o 27$ may be interchanged without substantially changing the performance of cell 13, provided elements 2-6 are replaced by semiconductors, and provided source V does not draw current.

A plurality of N cells can be mounted in series, like lead storage batteries, i.e., with the +pole of one cell connected to the −pole of the next cell, and so on. The connections are made by soldering copper wires between grid 5 of one cell and grid 3 of the next cell, and so on, or simply by sandwiching a plurality of sections, for example each section having thermoelements 3, 4 and 5, together between plates 1 and 7 through electrical insulators 2 and 6. Similarly, a plurality of N cells can be mounted in parallel, like lead storage batteries, i.e., with the +poles of cells tied together by copper wires and simultaneously tying together −poles of cells.

It will be appreciated that the system of FIG. 1 is for converting an appreciable amount of the sun's energy 19 incident upon panel 11 into electrical energy at output 18 of cell 13. Thus, the system of FIG. 1 competes with the conventional solar photo-voltaic or thermo-voltaic cell; the former being a drift current means and the latter being a photo-voltaic or Seebeck conversion means. It is to be expected therefore that while the practical efficiency of the conventional solar cell is 15%, the efficiency of the system of FIG. 1 is substantially equal to the efficiency of cell 13 since the efficiencies of solar panel 11 and heat exchanger 12 are almost 100%. It will also be appreciated that it is the ability of cell 13 to convert the heat supplied by heat exchanger 12 at high power and high efficiency compared to the conventional devices that is the outstanding feature of the invention. The actual power and efficiency which can be achieved in a practical design is limited only by the success for combining heat exchanger 12 and cell 13 to obtain the maximum transfer of heat from the former to the latter. Any one of a number of materials and practical geometries for heat reservoirs 17 and heat sinks 21 may be used to bring about the desired result in a given application. Moreover, external cooling from a cooler 23, including deep cooling for operating cell 13 at low or even superconducting temperatures, may be used as desired. For example, all or portions of wires connecting plates 3, 5 and load $R_o 27$ may be operated at the superconducting temperature $T_c$. An example of the use of a superconducting cooler for cooling current carrying wires of a cell is shown in U.S. Pat. No. 3,593,110. And, it will be obvious to replace solar absorber 11 and heat exchanger 12 by the direct illumination of cell 13 by the sun's radiation 19, the purpose of solar panel 11 and heat exchanger 12 being the providing of more heat and higher temperatures $T_H$ to cell 13 than is possible by the direct illumination method.

Another preferred implementation of cell 13, by way of example, is almost identical to a conventional p-n junction solar cell; the difference being that while the solar cell converts the sun's energy (photons) into a current near a junction, the invention cell 13 converts the photons into heat inside a semiconductor 4 and then using an external emf to drift the electrons, thereby forming a current I 18. Thus, cell 13 may be p- and n-type semiconductors sandwiched between a pair of plates 3 and 5 in the manner of a conventional solar cell. It will be appreciated that it is the contact potential of the junction between semiconductors of the solar sell which drives the cell to produce current. In contrast, it is the external emf applied to semiconductor 4 which drives the cell to produce current I 18. Since all the input heat is supplied directly to semiconductor 4 there is no comparable loss of energy being blocked, as is the case of the conventional solar cell which must utilize a fine mesh metal plate across semiconductor 4 on the sun side to limit resistive path losses and thereby loosing a portion (currently 5%-10%) of the available sun's illumination energy 19.

Of course, the resistive loss of the invention cell 13 can be reduced by controlling the area and length of semiconductor 4. But for its use of n- and p- doping to encourage rather than to suppress internal absorption of heat energy, semiconductor 4 may be otherwise identical to a conventional photo-voltaic cell. And, while cell 13 has been disclosed as a modified type of a conventional photovoltaic cell, by way of example, it will be obvious that cell 13 can be specified as any one of a number of devices having junctions including pairs of semiconductors, pairs of metals, semiconductor-metal pairs, and pairs arrayed and connected in series or in parallel to provide units as desired. For example, cell 13 can be specified as an n-type semiconductor and rectifier, as n- and p- type semiconductors, as n-p-n or p-n-p semiconductors sandwiched between metal plates 3 and 5, with the external assisting voltage or field V applied across semiconductor 4 in a manner to produce current I 18 without itself drawing current. The cooler 23 may be used to produce a temperature difference $\Delta T$ across some portion of semiconductor 4 for example between plates 3 and 5 and wires connecting load $R_o27$, for generating Seebeck and Thompson voltages for driving charges in semiconductor 4. It should be understood that cooler 23 may be applied to thermoelements of cell 13 as desired, for example drawing or providing heat, and may share a common heat exchange fluid with heat exchanger 12. It will be obvious therefore to construct cell 13 to obtain the desired performance in a given application.

As a direct solar absorber, thermoelectric cell 13 can be mounted inside a heat reservoir 17, for example inside a glass box which is being illuminated by the sun. Any one of junctions of thermoelements in cell 13 or between cell 13 and external connections can be implemented as a rectifying or ohmic junction, and a heat sink 21 may be employed to provide a temperature difference $\Delta T$ between two sides of a junction or thermoelectric material. Thermoelements in cell 13 may be an absorptive surface that absorbs and thermalizes as much of the incident light and thermal energy as possible. Thus, thermoelements and particularly semiconductor 4 may be ones that have low reflection in the visible spectrum and low radiation in the infrared spectrum. Such materials are sometimes referred to as a dark mirror, and often are constructed by alternate multiple layers of materials such as silicon dioxide and vapor coated aluminum. Suitable dark mirrors are commercially available and their specific construction forms no part of the present invention. Heat sink 21 may be in the form of a radiative surface which serves to dispose heat. Suitable radiators are commercially available and their specific construction forms no part of the present invention. Thus, if a temperature difference $\Delta T$ is needed then selected thermoelements of cell 13 will be radiators while if only a single temperature is needed all thermoelements in cell 13 will be absorbers. In general, semiconductor 4 comprises n- and p- type semiconductors sandwiched between plates 3 and 5. While in the conventional thermo-voltaic cell the n- and p- semiconductors are doped for maximum Seebeck or Thompson effects, these are doped for maximum heat absorption in the system of the invention.

From the foregoing it will be appreciated that cell 13 acts as a source which supplies direct current I 18 to the external load $R_o27$. Basically, the equivalent circuit of cell 13 is a heated resistor across which is applied an external emf. The external emf can be applied either as a voltage source V in series or in parallel with the resistor. If the voltage source V is in series with the resistor then current I 18 flows through the voltage source while if the voltage source is in parallel with the resistor then no current flows through the voltage source. Thus, placement of the voltage source in series or in parallel with the resistor calls for a different type of voltage source. For example, a parallel source is high impedance while a series source is low impedance.

Up to this point the disclosure has been primarily for a voltage source V in parallel with the resistor of cell 13. In what follows the disclosure will be for a voltage source V primarily in series with the resistor of cell 13. The general invention requirement is that the voltage source V does not supply or draw power to the load $R_o27$, i.e., voltage source V is decoupled from load $R_o27$, and serves the primary function of supplying the external emf across the resistor of cell 13. Moreover, certain applications require that the voltage source V be adjustable manually or automatically, for example using a thermocouple 8 to determine the temperature $T_H$ in heat reservoir 17 and provide a corresponding signal for controlling the output of voltage source V. It appears such requirements can be best accomplished when the voltage source V is in parallel with the resistance of cell 13, as shown in FIG. 1.

One interesting application for the system of FIG. 1 is its use in automobiles. Solar panel 11 would be made conformal with a vehicle's top side and would collect the sun's energy on the sun side and also would be heated from the inside. The heated exchange fluid would be provided to a heat exchanger 12 and to cell 13 inside the vehicle. The electricity would be used to do useful work, for example powering the battery, running the air conditioner, and possibly even supplying prime power in some applications. The system just described for automobiles could be designed to provide electrical energy to homes and buildings.

In comparing the costs of electrical power generated by conventional solar cells with the cost of power generated by the methods employed by electric utilities, the first criterion is the capital cost per kilowatt (KW) of output. At present while solar cells can be bought for about $15,000/KW, the cost of building a fuel burning power station is about $500/KW. Obviously, the cost of solar cells is far too high to outweigh the fact that no fuel is needed. Now, by making certain assumptions at this stage, we can compare the costs of using the FIG. 1 system of the invention with the costs of conventional solar cells and fuel burning utilities. For example, assuming that A is the area of solar panel 11, heat exchanger 12 and thermo-voltaic cell 13, $A_s$ is the area of a conventional solar cell, E=75% is the efficiency of the system of FIG. 1 (primarily of cell 13), and $E_s$=15% is the efficiency of the conventional solar cell, we see that the cost C of the system of FIG. 1 (primarily of cell 13) when compared to the cost $C_s$ of the conventional solar cell is related simply by $C E/A = C_s E_s/A_s$ which for $A = A_s/5$ gives C=$600/KW. If, additionally, the assumption is made that improvements can be made in a practical design then C approaching $500/KW indicates the expected feasibility of the system of FIG. 1 to produce electricity as an alternative to the conventional fuel burning power station. Since it is almost certain that the present costs of building conventional fuel burning power stations and of their conventional fuels will be increasing in time, the system of FIG. 1 will become even more attractive as an alternative to the fuel burning systems.

Referring to FIG. 2, the system of the invention may be more fully explained by considering cell 13 as being a series combination of a discrete resistor R 24 with external emf (not shown) and a discrete rectifier 25 which includes the resistance $R_j$ 26. For example, resistor R 24 represents semiconductor 4 and the rectifier 25 represents the rectifying or ohmic contact between semiconductor 4 and load $R_o$ 27. Resistor R 24 is at high temperature $T_H$ in heat reservoir 17 supplied by heat exchanger 12 while the rectifier or junction 25 is cooled at one end at temperature $T_c$ by a heat sink 21 which may be connected to a cooler 23. Thus, heat is supplied to resistor R 24 at temperature $T_H$, and a temperature difference $\Delta T = T_H - T_c$ is maintained across the rectifier 25 and resistor $R_j$ 26. It should be understood that the temperature difference $\Delta T$ may be positive or negative, i.e., for generating a positive or negative Seebeck or Thompson voltage, or $\Delta T$ may be zero, as desired.

Up to this point, the system of the invention has been disclosed using a rectifier or junction 25 with a heat exchanger 12 and cooler 23 to apply the temperature difference $\Delta T$ across the junction 25 and resistor $R_j$ 26. The purpose of having the temperature difference $\Delta T$ is dual. First, as in the prior art, to obtain useful amounts of electrical power using the Seebeck and Thompson effects. For example, a dc current I 18 flows when the temperature difference $\Delta T$ is maintained across the rectifier 25 and resistor $R_j$ 26. Second, to provide the external emf across resistor R24. For example, dc current I 18 flows through R 24 thereby causing a voltage drop. Thus, there are two sources for the current I 18; one is due to the Seebeck and Thompson effects across rectifier 25 and resistor $R_j$ 26, and the other is due to application of the external emf across resistor R 24. For example, dc current is generated in resistor R 24 by virtue of its temperature $T_H$ (which creates electrons and holes in R 24) and by having an externally applied emf whose source is the Seebeck or Thompson voltage in series with R 24. In effect, the temperature difference $\Delta T$ creates a Seebeck and/or Thompson voltage which produces Seebeck and Thompson electrons (where the temperature difference exists) and these electrons flow through and thereby establish an emf across resistor R 24 which emf acts to produce drift electrons in R 24 (at temperature $T_H$). In other words, the thermal source of electrons in R 24 combines with the Seebeck and Thompson sources of electrons in junction 25 and resistor $R_j$ 26 to produce the total current I 18. In the embodiment of FIG. 2, the voltage source V (junction 25 and resistor $R_j$ 26) is in series with resistor R 24 (semiconductor 4), in contrast to the embodiment of FIG. 1 wherein the voltage source V is in parallel with semiconductor 4.

It should be understood that, unlike the prior art, the system of the invention will operate equally well without the temperature difference $\Delta T$ applied across the rectifier R 25 and resistor $R_j$ 26, i.e., the invention will operate with $\Delta T = 0$. This is possible because the external voltage V used to provide the external emf across resistor R 24 can be in form other than the rectifier 25 and resistor $R_j$ 26, i.e., the external voltage V does not depend on the temperature difference $\Delta T$ for its operation. Thus, while in the prior art the Seebeck and Thompson voltage sources are used to produce the entirety of current I 18, these may also be used in the system of the invention but for the different purpose primarily of supplying the emf U across resistor R 24. For example, using the Seebeck and Thompson effects to provide the voltage V in series (as shown in FIG. 2) or in parallel (as shown in FIG. 1) with resistor R 24 (semiconductor 4) for producing all or the substantial portion of current I 18.

At normal temperatures $T_H$, $T_c$ and $\Delta T$, the current I can be carried by well known thermoelectric materials, for example p- and n- type semiconductors sandwiched between metal plates 3 and 5. At superconducting temperatures, the current I can also be carried by well known thermoelectric materials, for example using superconducting semiconductors and metals as suggested in U.S. Pat. No. 3,593,110. Employment of such superconducting materials allows thermoelectric elements to be considerably more compact when compared to a non-superconducting system designed to supply the same current I to load $R_o$. It will be obvious therefore to operate the system of the invention at superconducting as well as normal temperatures.

In non-discrete terms, resistor R 24 may be one of a linear, planar or volume resistance of one or both of a metal or semiconductor, while the rectifier 25 may be that of a junction between semiconductors, between metals, or between metals and semiconductors and having resistance $R_j$ 26. Cooling by a cooler 23 creates the temperature difference $\Delta T$, thereby forming Seebeck or Thompson voltage sources which can be used to drive charges in R 24. Alternatively an external emf produced by an external voltage source V may be used to drive charges in R 24. As suggested previously, it is desired to heat resistor R 24 and also to apply an emf across resistor R 24. While resistor R 24 absorbs heat and converts same to the thermal motion of electrons and holes, the emf across R 24 drives charges (electrons and holes) through rectifier 25. Thus, it will be obvious to those skilled in the art to provide, first, a resistor R 24 and, second, to apply an emf U from a voltage source V across resistor R 24 and thereby to produce the substantial part of current I 18. The voltage source may be either series or parallel.

FIG. 3 is a circuit diagram of a cell 13 comprising p- and n- type semiconductors 4a and 4b sandwiched between plates 3a, 3b and 5, with heat reservoir 17 kept at temperature $T_H$ and heat sink 21 kept at temperature $T_c$. The resistance of semiconductors 4a and 4b is R 24 and the junctions between plates 3a, 3b, 5 and semiconductors 4a and 4b form ohmic or rectifying junction 25 with resistance $R_j$ 26. A temperature difference $\Delta T = T_H - T_c$ may be applied between plates 3a, 3b and 5 and a current I 18 flows through the external load $R_o$ 27. The temperature difference $\Delta T$ creates a Seebeck or Thompson voltage across junction 25. Thus, it is to be understood that an external voltage V, for example a battery, Seebeck or Thompson voltage source, etc., can be connected in series or in parallel with semiconductors 4a and 4b to provide an external emf U across these units.

It is the drift current created by heating semiconductors 4a and 4b and then applying an external emf U across these elements that produces all or part of current I 18. It is also to be understood that any one of a number of possible junctions may be used, the p- and n- type semiconductors 4a and 4b in FIG. 3 being shown by way of example. Thus, the p- and n- type semiconductors 4a and 4b may be replaced by an n-p-n type or p-n-p type junction or junctions having alternate layers of p- and n- type semiconductors or of semiconductors and metals sandwiched between plates 3a, 3b and 5. Plate 5 may be a metal, a semiconductor or a dark mirror. And, a plurality of N cells 13 may be connected in series, in parallel, or in series-parallel, for example as shown in U.S. Pat. No. 3,225,208. In normal cooling, it will be obvious to use any one of a number of well known thermoelements for cell 13. Clearly, the resistor R 24, rectifier 25, and resistor $R_j$ 26 (of FIG. 2) are not discretes in this case (of FIG. 3) but are distributed over the volumes of thermoelements. In superconducting cooling, it will also be obvious to use any one of a number of well known superconducting elements for cell 13. Finally, it will be obvious to adjust the length and diameter of the p- and n- type semiconductors to obtain the desired values for the distributed resistors R 24 and $R_j$ 26.

To visualize the system operation of FIG. 3, heat at temperature $T_H$ flows from the heat reservoir 17 into the p- and n- type semiconductors 4a, 4b and plate 5 and from these goes to the heat sink 21. Heat is absorbed in the p- and n- type semiconductors 4a and 4b and in plate 5 and may be radiated from plates 3a and 3b. The heat is used in semiconductors 4a, 4b and in plate 5 to heat up charges which then assume random motions having long mean free paths compared to the case when no heat is available. The mean free path of a typical charge exceeds the distance between cell electrodes 3a, 3b and 5. The temperature of thermoelements in cell 13 produces Peltier and ohmic heat. The temperature difference $\Delta T$ may be used to produce Seebeck and Thompson voltages in junctions and thermoelements. The obvious design problem is to convert the substantial portion of the heat to charge motion in semiconductors 4a, 4b and in plate 5 and to apply an external emf U to move the charges thereby producing current I 18, while simultaneously minimizing the ohmic and other possible losses (convection, conduction, radiation) in thermoelements 3a, 3b, 4a, 4b and 5. The foregoing design problem is a straightforward one in heat transfer technology and thermo-voltaic conversion and it will now be obvious to select the appropriate thermoelectric materials and geometric configurations to obtain the substantial portion of current I 18 from drift charges in heated semiconductors 4a, 4b and plate 5.

FIG. 3 will now be used to further illustrate the principles of the invention, by way of example. Cell 13 may comprise p- and n- type semiconductors 4a, 4b sandwiched between plates 3a, 3b and 5. Plate 5 may be an absorber and semiconductors 4a, 4b, plate 5 and heat reservoir 17 may be combined to form a solid state unit, for example a dark mirror. Likewise, plates 3a, 3b may be absorbers or these may be radiators and, these may be combined with a heat sink to form a solid state unit, for example a radiator or absorber. A rectifying or ohmic junction may be formed at one or both junctions 25a and 25b. A plurality of junctions of semiconductors 4a and 4b may be used in series or in parallel.

If the sun's radiation 19 illuminates reservoir 17, plate 5 therein becomes heated relative to plates 3a, 3b, if these are kept at the temperature $T_c$ in heat sink 21. If an emf U is applied across semiconductors 4a, 4b, for example by putting these elements between the plates of a charged capacitor, as shown in FIG. 1 or by shunting a voltage source V across plates 3a and 3b, or by using a voltage source V in series with the load $R_o$ 27, a current I 18 flows in load $R_o$ 27. In the absence of this field, thermal charges in thermoelements would have their normal random motions without drift, i.e., charges would not flow as a current. In the presence of this field, charges will move or drift in the direction of the field and will produce all or part of current I 18. If resistance R 24 is in series with a rectifying junction 25, then drift charges from the interior of resistance R 24 will be added to Seebeck charges normally produced by the junction. In other words, the invention resistor R 24 will increase the number of electrons normally crossing junction 25. The actual amount of drift of electrons supplied to current I 18 depends on the value of the emf U as well as temperature $T_H$ (determines the conductivity $\sigma$). As a result of the current flow I 18, heated electrons in semiconductors 4a and 4b are circulated to and cooled in heat sink 21 and load $R_o$ 27. The cooling occurs because electrons pass from a high energy level in thermoelements in cell 13 to a low energy level in load $R_o$ 27. Thus, high energy drift electrons are obtained from cell 13 and these are used up in load $R_o$ 27 as electrons return to lower energy levels. In other words, the current I 18 is produced by applying emf U to a heated semiconductor in cell 13.

If junctions 25a, 25b are rectifying, then thermoelements 3a, 3b, 4a, 4b, 5 will produce the well known Peltier, Seebeck and Thompson effects. For example, the product of the thermoelectric power $S=2 \ k/e$, where $k$=Boltzman's constant and $e$=electron charge, and the absolute temperature $T_H$ is the Peltier coefficient $ST_H$. The Peltier coefficient relates to a cooling effect of magnitude $ST_H I$ as the current I 18 passes from the n- type semiconductor 4b to the p- type semiconductor 4a and a heating effect when passing from 4a to 4b. The Seebeck effect relates to the appearance of a voltage $S \ \Delta T$ when the temperature difference $\Delta T$ is maintained across a junction 25a or 25b. The Thompson effect relates to a cooling or heating effect as the current I 18 passes through a thermoelectric material with a temperature difference $\Delta T$.

Ideally, the electrical power which becomes available to the external load $R_o$ is the entire portion of the sun's radiation 19 being converted in cell 13 (a current source). Practically, however, the available power is reduced by several sources including Joule heat, conducted heat, and Peltier heat. Joule heat is generated internally in the thermoelements as the current I 18 passes through cell 13. Conducted heat is transmitted between thermoelements by thermal conduction if the temperature difference $\Delta T$ is present. Peltier heat relates to the Peltier effect discussed previously. The obvious design problem is to limit the undesired sources of power loss and thereby to insure that the substantial portion of the sun's radiation is made available to cell 13. If an external voltage source V is connected in series with cell 13 it will contribute to the current I 18 and, also, it will supply all or part of the external emf U across cell 13.

In general, the current I 18 and corresponding power P in load $R_o$ 27 are given by $$I = I' + I'' \quad P = I^2 R_o \qquad (1)$$

in which I' is the current from cell 13 (a current source) and I" is the current from a voltage source V in series with cell 13, for example a Seebeck voltage.

Referring to FIG. 2, the current I' is due to the drift of charges in R 24 (see Sec. 6.1a in the foregoing reference to A. van der Ziel). If the series voltage V is zero, for example, when junction 25 is ohmic and no other series voltage V is present, then I"=0. However, if a series voltage V is present, for example if junction 25 is a rectifying junction, it will produce the Seebeck voltage $S \Delta T$ where $S = 2 k/e$ is the thermoelectric power of cell 13 and $\Delta T$ is the temperature difference across junction 25. Thus, for the single cell 13

$$I' = \sigma U \qquad I'' = \frac{S \Delta T}{R + R_o} \qquad (2)$$

where $\sigma$ is the conductivity and U is the externally applied emf. In (2) the conductivity $\sigma$ is a function of the temperature $T_H$ ($\sigma$ increases with temperature $T_H$).

In equations (1) and (2), I' is a new current not anticipated by the prior thermoelectric power art which provides only the Seebeck current I". Physically, the invention curent I' is distinct from the prior art Seebeck current I"; the former arises from the application of an emf U across R 24 (from series or parallel sources of voltage V) and thereby causing charges in R 24 (heated semiconductor 4 in FIG. 1) to drift while the latter is the well known Seebeck effect obtained by maintaining the temperature difference $\Delta T$ across junctions of thermoelements. Both effects will contribute component currents to current I 18 and the Seebeck effect, if present, will also contribute all or part (if no other voltage source V is present) of the external emf U across reservoir 17. Generally then, if a voltage source V is present in series with R 24

$$U = \frac{VR}{R + R_o} \qquad (3)$$

which can then be used as the driving emf to produce current I' in equation (2).

There are two basic design considerations for cell 13; first operation at maximum power and, second, operation at maximum efficiency. Maximum power is obtained by maximizing the current I 18 in equation (1). If the series voltage V is not present then I"=0 and maximizing the current I 18 in (1) is a straightforward task, namely, this can be done by connecting N cells in parallel. Since the N parallel current sources add, the current I 18 is given by $$I = N \, U/R \qquad (4)$$

in which the external emf U=V is supplied by a voltage source V in parallel with cell 13, for example a voltage source V across capacitor plates 1 and 7, or a grid voltage in semiconductor 4, or a voltage source with high impedance shunted across plates 3a and 3b in FIG. 3.

If the series voltage V is present then it will produce the current I" and emf U (3). For example, voltage V may be a Seebeck voltage $V = S \Delta T$ produced in junction 25 in series with R 24. If N cells 13 are connected in series then simple circuit considerations show that $$I = \frac{2 N V}{NR + R_o} \qquad (5)$$

while if N cells 13 are connected in parallel then $$I = \frac{2 N V}{R + N R_o} \qquad (6)$$

from which, equations (4)–(6), we conclude that the current I can be increased simply by increasing the number of cells N, increasing the externally applied voltage V, and decreasing the resistance R. Ideally, this can be done without limit in (4). However, increasing N reaches the limit $I = 2V/R$ when $NR >> R_o$ in (5) and $I = 2V/R_o$ when $R_o >> R/N$ in (6). In either case, an upper current limit is reached as N increases. However, increasing N also increases the internal resistance of the series connected cells but decreases the internal resistance of the parallel connected cells. Thus, it is preferred to have cells connected in parallel in any case whether the series voltage V is present or not . In (5) and (6), the factor 2 is due to the invention current $I' = U/R$, as example. In other words, the presence of the invention current I' in a conventional system based on the Seebeck effect will double the amount of current and therefore quadruple the amount of power which can be provided by the system.

The efficiency $E = P/(P + I^2 R')$ is defined as the ratio of the usable power P and the sum of the usable power P and the ohmic power loss $I^2 R'$ in cell 13 comprising N cells and having the total resistance R' where R'=NR for serial and R'=R/N for parallel connection of cells. In view of equation (1)

$$E = \frac{1}{1 + \frac{R'}{R_o}} \qquad (7)$$

which indicates the efficiency E, like the current I and power P, is a dependency of the number of cells N. Maximum 100% efficiency is obtained by making the total resistance R' of cell 13 much smaller than the load resistor $R_o$27. Thus, the condition for maximum efficiency is given by $$R' << R_o \qquad (8)$$

which is easily satisfied for the cases of (4) and (6) but which results in a low current if satisfied for the case of (5). Ideally then, maximum current and power is achieved at maximum 100% efficiency using the parallel connection of cells 13, preferably without an external voltage source V in series with cell 13.

From the foregoing, it should be clear that when cell 13 includes a series voltage source V, there is an upper limit to the current I 18 which can be achieved when connecting cells 13 in series or in parallel. If there is no series voltage source V, there is no such upper limit for the current I 18. Since, with two exceptions, the prior art cells are voltage sources they suffer the restriction imposed by the current limits which result when connecting cells in series and in parallel. The two known exceptions are the current sources of the foregoing "differential work function" and "charge diffusion" systems. In principle, these prior art systems are not restricted by current limits when connecting cells in series and in parallel. However, the individual cells of these prior art systems provide small current, and as a consequence cells deliver small amounts of power. The "differential work function" system while having high cell conductivity has low cell electric field and it is the latter which limits the cell drift current. The "charge diffusion" system while capable of having high gradients of charge concentration has low cell conductivity and it is the latter which limits the cell diffusion current. In contrast, the invention cell 13 has a high cell conductivity combined with high cell electric field and thereby produces substantial amounts of drift current, practically without limit. Nowhere does the prior art approach the substantial current I 18 generation capacity provided by the invention.

FIG. 4 is a schematic diagram of an embodiment combining a heat exchanger 12 and thermoelectric 13. The heated exchange fluid at inlet 16 may be a liquid or gas, for example hot water, which is circulated into a heat exchanger 12. The exchanger 12 is shown as a pin fin heat exchanger for maximizing the heat transfer between the fluid and thermoelements comprising p- and n- type semiconductors 4a, 4b and me'al plate 5 sandwiched between metal plates 3a, 3b. Plates 12a, 12b may be formed by etching or attaching metal pins 6 at selected locations. Reservoir 17 can then be sandwiched between plates 12a and 12b. Reservoir 17 is electrically insulated from the exchange fluid. Thus, the system of FIG. 4 includes a pin fin heat exchanger with metal pins or posts 6 at selected locations of plates 12a, 12b as desired. Typically, the pin fins or posts 6 have diameters between 0.05 and 0.5 inches (0.127 and 1.270 cm), spacings of between 3 and 4 pin diameters, and pin heights between 1 and 10 pin diameters. The smallest diameter, closest spacing, and longest pin height-to-diameter ratio gives the highest effective heat transfer coefficients. Much of this can be seen in NASA Report TM-X-3173(N75-14990) "Surface Heat Transfer Coefficients of Pin Finned Cylinders" and in the article by M. Grossman, "Pins cool better than fins and push up power-supply ratings" appearing in the July 19, 1978 issue of Electronics Design. The foregoing indicate that a heat exchanger using pin fins 6 will exchange the same amount of power as does a unit without pin fins 6 but with 10 times the surface area. Thus, the system of the invention may employ pin fins 6 to throughly mix the exchange fluid and thereby increase the thermal efficiency of transferring heat from the fluid into the thermoelements inside reservoir 17. All thermoelements may use a heat transparent or absorbing protective insulation to allow their operation with the heated exchange fluid. Heat reservoir 17 contains resistance R 24 and receives heat from the heated fluid while heat sink 21, if needed, may be a fluid tight insulator coating the inside or outside of metal plates 12a, 12b. Of course, it is desired to direct the heat into reservoir 17 and to prevent metal plates 12a, 12b from radiating heat away from reservoir 17. This problem is made easier by sandwiching a plurality of cells 13 between metal plates 12a and 12b. Insulation of thermoelements may also be needed to prevent electrical shorting by the fluid. Plates 12a, 12b can be formed as planar or cylindrical plates and may be sealed on their ends to confine the flow of the liquid. Current I 18 is supplied by cell 13 to the external load resistance $R_o$ 27 and the cooled exchange fluid is available at outlet 20. Ideally, the temperature of the fluid at outlet 20 should be at the temperature of the cold fluid at inlet 14. However, a cooler 23 may be connected directly to metal plates 3a, 3b and may use the same or another exchange fluid. Cooler 23 may be needed to establish a temperature difference $\Delta T$ between plates 3a, 3b and 5 and thereby to provide the emf across heated resistor R 24 in reservoir 17. As discussed previously, the external emf may also be provided by using an external voltage V across thermoelements, for example as shown in FIG. 1. Apart from the advantage of compactness and cost savings, the system of FIG. 4 permits a substantially higher level of temperature operation of cell 13. In other words, the foregoing concept for integrating the heat exchanger 12 with a cell 13 will increase the overall thermal efficiency of providing heat to reservoir 17 at considerably reduced size, thus reducing the power, equipment and costs of converting a heated exchange fluid to electricity.

In many applications it is desired to convert energy from one form to another. Such applications might include converting the sun's energy to a heated fluid, converting the heated fluid to radiating, convecting or conducting heat, and converting the heat to electricity. Such applications might be for capturing the sun's energy or for converting combustion, fission and geothermal energy to electricity. The system of the invention provides highly efficient thermoelectric cells which can be used in many such applications. The apparatus is quite simple in principle and comprises a thermionic device, for example a resistor R 24 with an applied emf, for converting heat directly to electricity. When combined with existing high temperature solar collectors and heat exchangers there is provided high power efficient thermoelectric power generating systems. The method is equally simple and comprises the steps of heating an absorber, for example a resistor, and then applying an external emf to the resistor to obtain useful current. As specified, the system of the invention provides new and improved power generating systems in solar collectors, fossil fuel and nuclear power plants, electrical utilities, and systems used for powering, heating and cooling vehicles, aircraft, satellites, homes, buildings, electronic, agricultural, construction and machine tool equipment. For example, systems constructed following the system of the invention are expected to convert the sun's energy and energy provided by fossil and nuclear fuels to electricity at high powers and high efficiencies.

From the foregoing, it will be seen that the thermoelectric power system of the invention provides a new compact device which can be used in a variety of applications where energy must be converted directly to electricity.

I claim:

1. In a thermoelectric generator for converting heat directly from a heat source into electrical energy, the combinatin of:
    at least one active cell comprising a semiconductor means sandwiched between a pair of metal electrodes;
    means including a heat source for heating at least portions of said cell;
    means including one of a voltage or current source for applying an external electromotive force (emf) to said semiconductor means, said emf producing the drifting of charges and thereby producing a current in said semiconductor means, said drifting of charges being along a path one of smaller or greater than the mean free path of charges, said source being substantially decoupled from said current in said semiconductor means; and
    means for connecting an external load across said metal electrodes for receiving the current generated by said semiconductor means.

2. A thermoelectric unit according to claim 1 in which said semiconductor means includes a resistor.

3. A thermoelectric unit according to claim 1 in which said semiconductor means includes a combination of p- and n- type semiconductors.

4. A thermoelectric generator unit according to claim 1 in which said semiconductor means combines at least one thin film semiconductor in combination with at least one thin film metal, with semiconductor and metal thin films successively deposited by evaporation in vacuum upon the surface of at least one of said metal electrodes.

5. A thermoelectric generator unit according to claim 1 including a plurality of said cells electrically connected in series.

6. A thermoelectric generator unit according to claim 1 including a plurality of said cells electrically connected in parallel.

7. A thermoelectric generator unit according to claim 1, including an energy absorber having an energy source as input and providing a heat exchange fluid as output, with said absorber connected as input to a heat exchanger for providing said heat source.

8. A thermoelectric generator unit according to claim 1 in which the heat source receives its heat from the sun.

9. A thermoelectric generator unit according to claim 1 wherein said heat source provides its heat to the cell through a heat reservoir surrounding said portions of said cell being heated.

10. The thermoelectric generator unit according to claim 1 wherein said heat source is a pin fin heat exchanger.

11. A thermoelectric generator unit according to claim 1 including a cooler for cooling a portion of said cell.

12. A thermoelectric generator unit according to claim 1 including means for applying a temperature difference between selected ones of elements of said cell.

13. A thermoelectric generator unit according to claim 1 including cooling means for operating selected ones of elements of said cell at superconducting temperatures.

14. A thermoelectric generator unit according to claim 1 in which said source is provided by a battery.

15. A thermoelectric generator unit according to claim 1 in which said source is provided by a device whose principle of operation employs the Peltier, Seebeck or Thompson effects.

16. A thermoelectric generator unit according to claim 1 including means for adjusting said source as a function of the temperature of heat source.

17. A thermoelectric generator unit according to claim 1 wherein said emf is applied to said semiconductor means through a grid in said semiconductor means.

18. A thermoelectric generator unit according to claim 1 wherein said source also supplies power to the load.

19. A method for converting heat directly from a heat source into electrical energy, comprising the steps of:
forming at least one active cell by sandwiching a semiconductor means between a pair of metal electrodes;
heating at least a portion of the cell to a temperature $T_H$;
applying an external electromotive force (emf) to the semiconductor means using one of a voltage or current source, producing the drifting of charges and thereby producing a current in said semiconductor means, said drifting of charges being along a path one of smaller or greater than the mean free path of charges, substantially decoupling said source from the current in said semiconductor means; and
shunting an external load across the metal electrodes for receiving the current generated by the semiconductor means.

20. The method of claim 19 including the step of forming the semiconductor means as at least one thin film semiconductor in combination with at least one thin film metal by successively depositing thin films by evaporation in vacuum upon the surface of one or both of said metal electrodes.

21. The method of claim 19 including the step of providing a plurality of said cells connected in series.

22. The method of claim 19 including the step of providing a plurality of said cells connected in parallel.

23. The method of claim 19 including the steps of:
converting energy to heat an exchange fluid; and
heating the cell with the heated exchange fluid.

24. The method of claim 19 including the step of receiving heat energy in said heat source from the sun.

25. The method of claim 19 including the step of providing heat to the cell from the heat source through a heat reservoir.

26. The method of claim 19 including the step or providing radiated heat to the cell from the heat source.

27. The method of claim 19 including the step of providing convected heat to the cell from the heat source.

28. The method of claim 19 including the step of providing conducted heat to the cell from the heat source.

29. The method of claim 19 including the step of cooling a portion of the cell to a temperature $T_c$.

30. The method of claim 19 including the step of providing a temperature difference $\Delta T$ between selected ones of elements of the cell.

31. The method of claim 19 including the step of operating selected ones of elements of the cell at superconducting temperatures.

32. The method of claim 19 including the step of providing emf from a source as a device whose principle of operation employs the Peltier, Seebeck or Thompson effects.

33. The method of claim 19 including the step of providing emf from a battery.

34. The method of claim 19 including the step of adjusting the source as a function of the temperature $T_H$ of the heat source.

35. The method of claim 19 including the step of applying the emf to the semiconductor means through a grid in the semiconductor means.

36. The method of claim 19 including the step of supplying power from the source to the load.

* * * * *